United States Patent [19]

Ohba

[11] Patent Number: 4,751,477
[45] Date of Patent: Jun. 14, 1988

[54] SEMICONDUCTOR LASER LIGHT MODULATION AND DEMODULATION SYSTEM

[75] Inventor: Ryoji Ohba, Sapporo, Japan

[73] Assignee: Hokkaido University, Sapporo, Japan

[21] Appl. No.: 763,923

[22] Filed: Aug. 8, 1985

[30] Foreign Application Priority Data

Aug. 22, 1984 [JP] Japan ............................. 59-173107

[51] Int. Cl.$^4$ ..................... H01S 3/117; H01S 3/00
[52] U.S. Cl. ............................... 332/7.51; 350/358; 350/371; 455/611; 455/613
[58] Field of Search ............... 332/7.51; 350/358, 371; 356/349; 372/20, 28; 455/611, 613

[56] References Cited

U.S. PATENT DOCUMENTS

| | | | |
|---|---|---|---|
| 3,503,012 | 3/1970 | Gillard | 356/349 |
| 3,504,302 | 3/1970 | Fenner | 372/28 |
| 3,572,935 | 3/1971 | Howell et al. | 356/349 |
| 3,754,142 | 8/1973 | Angelback | 350/358 |
| 4,346,999 | 8/1982 | Massie | 356/349 |
| 4,546,458 | 10/1985 | Cielo et al. | 350/358 |
| 4,552,632 | 7/1985 | Yamashita et al. | 350/358 |
| 4,586,184 | 4/1986 | Hess | 372/28 |
| 4,592,058 | 5/1986 | Mongeon et al. | 372/28 |
| 4,594,003 | 6/1986 | Sommargren | 356/349 |

OTHER PUBLICATIONS

Sov. Phy. Semicond., vol. 9, No. 8, Anzin et al., pp. 959–961, S113-7603-E, S6060.0117), 1976.
S86170029A, Britov et al., Sov. J. Quantum Elect., vol. 7, No. 6 (6/77), pp. 793–794.
Fundametals of Optics, Jenkins et al. (1976), McGraw-Hill, N.Y., pp. 272, 277, 278.

*Primary Examiner*—Salvatore Cangialosi
*Attorney, Agent, or Firm*—Bell, Seltzer, Park & Gibson

[57] ABSTRACT

A semiconductor laser light modulation and demodulation system to be used in light communication system is realized. In the modulation system, strength modulated pressure wave or electromagnetic wave is directly applied to an active region of a semiconductor laser element and the frequency modulation is effected by varying an effective length of a laser resonator formed by the element. In the demodulation system, modulation signal is derived by an interference of the received laser light by splitting and then joining together after passing an interferometer having different path length arms.

8 Claims, 1 Drawing Sheet

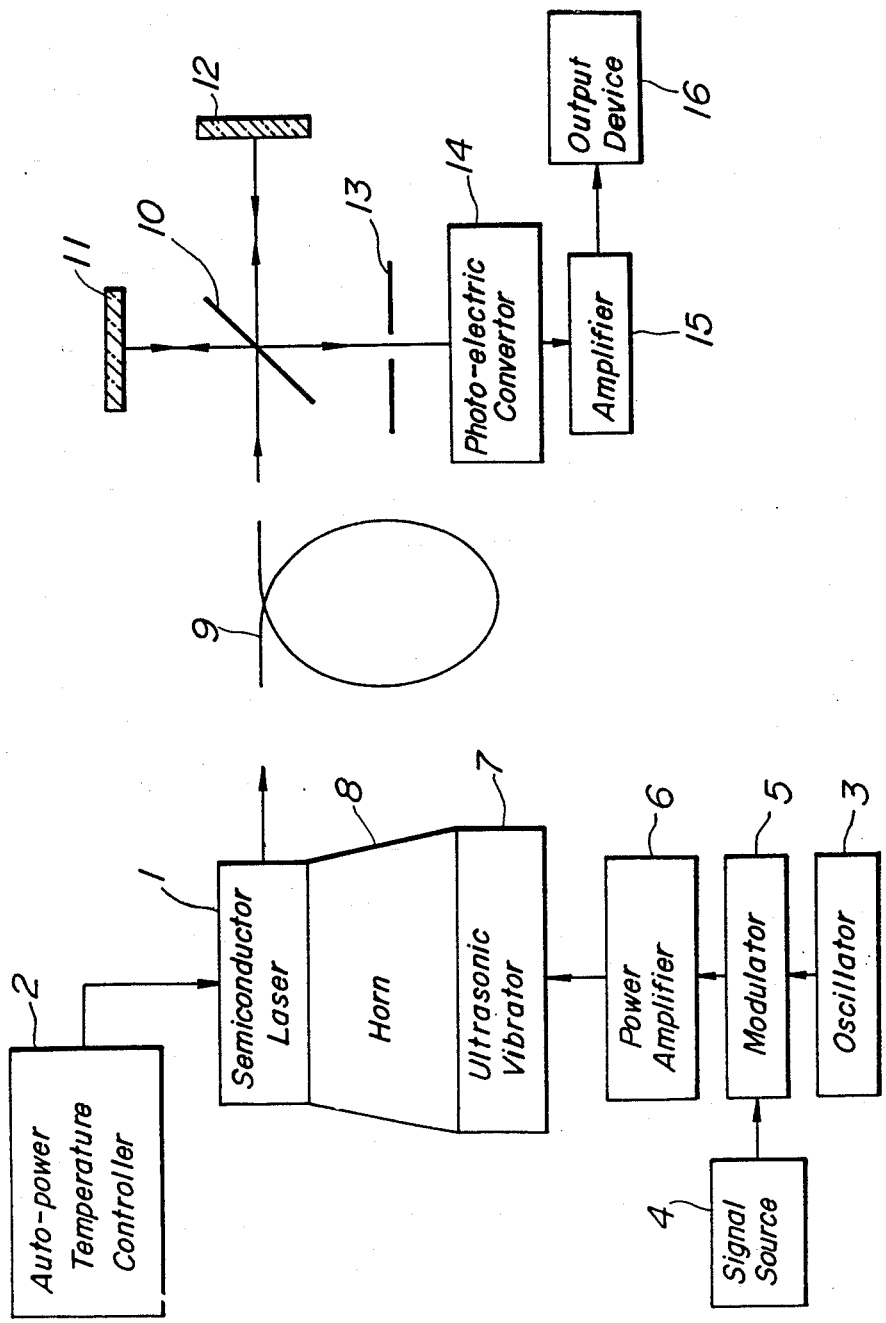

SEMICONDUCTOR LASER LIGHT MODULATION AND DEMODULATION SYSTEM

BACKGROUND OF THE INVENTION

(1) Field of the Invention

The present invention relates to a semiconductor laser light modulation and demodulation system in which the semiconductor laser light is modulated and demodulated for realizing a light communication system. More particularly, the present invention is to stably modulate and demodulate the frequency of semiconductor laser light which does not have a narrow spectrum band width and hence the oscillating frequency is usually unstable.

(2) Prior Art

A semiconductor laser light device has hitherto been used conveniently in view of its compact size and easy handling. This kind of semiconductor laser device is applied for instance in a light communication system. Such a communication system is sub-classified into two systems. One of which is incoherent system, in which the strength or intensity of the laser light is modulated. The other one is coherent system, in which the phase or frequency of the laser light is modulated. In so far, only the incoherent system of modulating the strength of the laser light has been used. As a principle of the laser light strength modulation, a modulation signal is superposed on the driving current supplied to the semiconductor laser element and the variation of the laser light strength at the oscillator output varying according to the modulation signal is utilized.

However, in such an incoherent strength modulation of the laser light, the variation of the strength of the laser light oscillation output inevitably accompanies other variations, like an irregular hopping of the oscillation mode of the laser light due to variation of the driving current. Accordingly, a good signal to noise ratio in the laser light oscillation output has not been obtained. Further with respect to the drift speed of the carrier of the laser light, there was a disadvantage in that the upper limit of the signal frequency being able to be modulated is limited up to some GHz order.

On the other hand, the coherent system, in which the laser light is frequency or phase modulated, is still just in a beginning stage or research stage to check the possibility of realization based on so called "analogie" for the frequency modulation of the electromagnetic wave. Moreover, the semiconductor laser light has a wider spectrum band width and the oscillating frequency itself is unstable. Thus the present problem is how to obtain a narrower frequency spectrum of such a semiconductor laser light and also how to stabilize the oscillation. Under such situation of the development of the technique in this field, a system to realize the frequency modulation or phase modulation by intentionally varying the frequency or phase of the laser light has never been established.

SUMMARY OF THE INVENTION

The object of the present invention is to mitigate the above-mentioned disadvantages of the conventional systems and to realize a novel semiconductor laser light modulation and demodulation system to be used in coherent laser light communication system by applying frequency modulation to the oscillating laser light output of the semiconductor laser element having inherently unstable oscillation frequency.

In the semiconductor laser light modulation and demodulation system according to the present invention, the frequency of the laser light oscillation output of a semiconductor laser element is modulated with a modulation signal by causing an oscillation of a semiconductor laser element by supplying a current exceeding a certain threshold value and by applying strength modulated pressure wave or electromagnetic wave to an active region of said semiconductor laser element to cause a variation in an effective length of a laser resonator formed by said semiconductor laser element. Further the system is characterized in that said laser light oscillation output is divided into two parts and to let the each part to pass two light paths having different path length and thereafter joined together to cause an interference therebetween thus to demodulate the same frequency component with the pressure wave or the electromagnetic wave included in the strength variation of said joined laser lights and to derive the modulation signal therefrom.

BRIEF DESCRIPTION OF THE DRAWING

The single drawing accompanied herein is a blockdiagram showing one example of the semiconductor laser light modulation and demodulation system according to the present invention.

DETAILED EXPLANATION OF A PREFERRED EMBODIMENT

The invention will now be described by referring to the accompanying drawing.

The drawing shows one embodiment of a semiconductor laser light modulation and demodulation system according to the present invention.

As can be seen from the drawing, the system comprises a semiconductor laser element 1, an automatic power and temperature controlling device 2 for controlling supply of the power to the semiconductor laser element 1 and for controlling the operating temperature thereof automatically, an oscillator 3 for generating a carrier wave to be modulated as the signal of the semiconductor laser element 1, a signal source 4 for generating a modulation signal, a modulator 5 for strength modulating the carrier wave supplied from the oscillator 3 by the modulation signal fed from the signal source 4, a power amplifier 6 for amplifying the modulated carrier wave supplied from the modulator 5, an ultrasonic vibrator 7 for generating an elastic wave having the strength modulated by the modulation signal according to the applied power amplified and modulated carrier wave fed from the power amplifier 6, and a horn 8 for converging said modulated elastic wave and for applying it concentratedly to an active region of the semiconductor laser element 1. By the above-mentioned constituting elements 1 to 8, a modulation system is formed.

In the above-mentioned modulation system, the semiconductor laser element 1 emits a modulated laser light in a manner more fully described hereinbelow. The emitted modulated laser light is transmitted via an optical fiber 9 to a demodulation system including various elements 10 to 16, which will be referred hereinbelow.

Namely, the demodulation system comprises a light beam splitter 10 consisting for instance of a half-silvered plate, reflecting mirrors 11 and 12 for reflecting the respective light beams splitted from the beam splitter 10, a slit 13 for limiting the width of the light beam emitted from the beam splitter 10, a photo-electrical converting element 14 for converting the light beam passing through the slit 13 into an electric signal, an amplifier 15 for amplifying the electric signal derived from the photo-electric converting element 14, and an output device 16 for utilizing the output from the amplified electric signal fed from the amplifier 15 for instance by recording or by displaying it.

The operation of the laser light modulation and demodulation system will be explained hereinafter.

The semiconductor laser element 1 transmits output laser light of a constant strength and a constant mode oscillation under control of the automatic power and temperature controlling device 2. On the other hand, the carrier wave supplied from the oscillator 3 to the modulator 5 is modulated for its strength by the modulation signal fed from the signal source 4. Then the modulated signal is applied to the ultrasonic vibrator 7 via the power amplifier 6 and irradiates an elastic wave of which strength is modulated by the modulation signal. The strength modulated elastic wave is converged in the horn 8 and is concentratedly applied to a laser resonator (not shown) formed mainly by the semiconductor laser element 1 from normal direction thereto. By this the density of the active region of the semiconductor laser element 1 is varied according to the strength variation so that the index of refraction and hence the active length of the laser resonator is varied and thus the effective length of the laser resonator, which is a product of the length of the resonator and the index of refraction is varied accordingly. As the result, the laser light oscillation output of the semiconductor laser element 1 is modulated for its frequency by the modulation signal. The modulated signal is in proportion to the strength variation of the applied elastic signal.

The frequency modulated laser light beam modulated in the modulation system in a manner mentioned in the foregoing is transmitted to the demodulation system via the optical fiber 9 and is divided into two parts by the beam splitter 10. Namely, the received laser light beam is splitted into two parts and of which first one is a reflected beam by the half-silvered plate arranged in a direction of 45° with respect to the axis of the incident light beam and this first part having changed the direction normal to the incident direction, and the second part is the penetrated laser beam having the same direction with the incident laser beam direction. The two parts of the beam may proceed to the two reflecting mirrors 11 and 12 and by the reflection they return to the split point and then they are joined into one beam after passing through the splitter and the directions is again changed by 90° by the beam splitter as can be seen from the drawing.

At the splitting and joining of the laser beams, the distances between the beam splitter 10 and the two reflecting mirrors 11 and 12, respectively, are shifted by a certain suitable amount from each other so that a suitable difference in the path lengths of the two laser beams is produced. Thus an interferometer having unequal arm lengths is formed by the beam splitter 10 and the two reflecting mirrors 11 and 12. Accordingly, there will be an interference between the two laser beams once splitted and then joined together, and by this reason, an intensity variation occurs in accordance with the applied frequency modulation originally. By applying thus joined beams joined by the beam splitter 10 to the photo-electric converter element 14 via a slit 13 an intensity variation according to the frequency modulation is detected and this intensity variation can be detected by the element and it is converted into a voltage signal. This voltage signal is fed to an amplifier 15 and is amplified by tuning with a carrier frequency and the modulated signal can be obtained again. The demodulated signal is used in the output device 16.

The illustrated semiconductor laser light modulation and demodulation device may be modified for its construction partly or greatly. For instance, the laser light oscillation output of a semiconductor laser element having conventional construction may be applied to a known photoelectric effect element and the frequency or the phase thereof may be varied according to a modulating signal. The interferometer with unequal arms in the demodulation system may be substituted by one having a same construction with an FM demodulation circuit for an FM electromagnetic wave, and a same modulation signal may be obtained by demodulation after obtaining stabilization of the oscillation frequency of the semiconductor laser element.

The combination of the ultrasonic vibrator 7 and the converging horn 8 in the modulation system in the illustrated construction can be modified in a manner to form a combination of an antenna of a millimeter wave or microwave and a coupler, or a combination of a modulatable light emitting element and an optical converging element. Also by this construction a same function and effect can be obtained.

In the semiconductor laser light modulation and demodulation system having the illustrated construction, the input system 3 to 8 to the semiconductor laser element 1 may be omitted and a pressure wave such as vibration or an electromagnetic wave like an optical light may directly by applied to the semiconductor laser element 1 from outside and by arranging to detect frequency variation of the laser light according to the applied power, sensors of various types being respondable with various pressure wave or electromagnetic wave may be obtained.

As can clearly be understood from the foregoing explanation, the output laser light of a semiconductor laser oscillation can be modulated in the frequency by applying the modulation signal in superposition with a pressure wave or an electromagnetic wave directly to an active region of the semiconductor laser element according to the invention. The output of such a frequency modulated laser light beam may further be applied to an optical system forming an interferometer with unequal arms and by demodulating it by a so called self-beat method, the conventional adverse conditions inherent to the semiconductor laser oscillation output light such as the unsatisfactorily frequency stability and spreading of the spectrogram may be mitigated and an effect of stable frequency modulation and demodulation can be obtained.

I claim:

1. A coherent light communication system, comprising:
   (a) a semiconductor laser element forming a laser resonator arranged to oscillate when a current exceeding a threshold value of the element is applied and thereby provide a laser light;
   (b) means for applying an amplitude modulated carrier wave selected from the class consisting of pressure waves and electromagnetic waves to said laser element, so that the effective length of said laser resonator is thereby varied and a frequency modulated laser light is thereby provided;

(c) unequal arm interferometer means adapted to receive said frequency modulated laser light for demodulating said laser light and generating an intensity modulated light therefrom; and (d) photo-electric converter means operatively associated with said unequal arm interferometer means for generating a voltage modulated signal from said intensity modulated light.

2. An apparatus as claimed in claim 1, wherein said means for applying an amplitude modulated carrier wave to said laser element comprises (a) signal source means for providing a modulation signal; and (b) means responsive to said modulation signal for amplitude modulating said carrier wave.

3. An apparatus as claimed in claim 5, further comprising amplifier means responsive to said photo-electric converter means for amplifying said voltage signal by tuning with a carrier frequency to regenerate said modulation signal.

4. An apparatus as claimed in claim 6, further comprising automatic power and temperature control means operatively associated with said semiconductor laser element for generating a laser light of constant strength and constant mode operation therefrom.

5. A coherent light communications system, comprising:

(a) a semiconductor laser light source having a laser resonator;

(b) automatic power and temperature control means operatively associated with said semiconductor laser light source for generating laser light of constant strength and constant mode operation therefrom;

(c) a signal source for providing a modulation signal;

(d) means responsive to said modulation signal for generating a pressure wave, wherein the amplitude of said pressure wave is modulated by said signal;

(e) means operatively associated with said semiconductor laser for applying said pressure wave to said semiconductor laser to vary the active length of said laser resonator, so that the frequency of said laser light is thereby modulated;

(f) unequal arm interferometer means adapted to receive said frequency modulated laser light for splitting and rejoining said laser light, so that said regioned laser light is an intensity modulated light modulated in accordance with the frequency modulation of said laser light; and (g) photo-electric converter means for detecting said intensity modulated light and producing a voltage modulated electric current therefrom.

6. An apparatus as claimed in claim 5, wherein said means for generating a pressure wave comprises an ultrasonic vibrator.

7. An apparatus as claimed in claim 6, wherein said means for applying said pressure wave to said semiconductor laser comprises a horn for converging said pressure wave onto said laser resonator.

8. An apparatus as claimed in claim 7, further comprising amplifier means responsive to said photo-electric converter means for amplifying said voltage signal by tuning with a carrier frequency to regenerate said modulation signal.

* * * * *

UNITED STATES PATENT AND TRADEMARK OFFICE
CERTIFICATE OF CORRECTION

PATENT NO. : 4,751,477

DATED : June 14, 1988

INVENTOR(S) : Ryoji Ohba

It is certified that error appears in the above-identified patent and that said Letters Patent is hereby corrected as shown below:

In column 5, line 18, change "5" to -- 2 --.

In column 5, line 23, change "6" to -- 3 --.

Signed and Sealed this

Eighteenth Day of October, 1988

Attest:

DONALD J. QUIGG

Attesting Officer

Commissioner of Patents and Trademarks